US006660414B1

(12) United States Patent
Xiang et al.

(10) Patent No.: US 6,660,414 B1
(45) Date of Patent: Dec. 9, 2003

(54) TUNGSTEN-DOPED THIN FILM MATERIALS

(75) Inventors: Xiao-Dong Xiang, Alameda, CA (US); Hauyee Chang, Berkeley, CA (US); Chen Gao, Berkeley, CA (US); Ichiro Takeuchi, Albany, CA (US); Peter G. Schultz, Oakland, CA (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 09/299,805

(22) Filed: Apr. 26, 1999

(51) Int. Cl.$^7$ ................................................ B32B 9/00
(52) U.S. Cl. ........................ 428/697; 428/702; 428/701; 428/699; 428/689; 501/134; 501/135; 501/136; 501/137; 501/139; 106/286.2; 106/286.4; 106/286.6; 106/286.8; 106/287.19
(58) Field of Search .................... 428/697, 688, 428/702, 689, 699, 701; 501/139, 134–137; 106/286.1, 286.2, 286.4, 286.8, 286.6, 287.18, 287.19

(56) References Cited

U.S. PATENT DOCUMENTS

| | | | |
|---|---|---|---|
| 5,319,517 A | * | 6/1994 | Nomura et al. |
| 5,723,361 A | | 3/1998 | Azuma et al. |
| 5,853,500 A | | 12/1998 | Joshi et al. |
| 5,874,379 A | | 2/1999 | Joo et al. |
| 5,889,696 A | * | 3/1999 | Kawakubo et al. |
| 6,139,780 A | * | 10/2000 | Desu et al. |

OTHER PUBLICATIONS

Knauss, L.A., et al., "The Effect of Annealing on the Structure and Dielectric Properties of $Ba_xSr_{1-x}TiO_3$ Ferroelectric Thin Films," Appl. Phys. Lett. 69:(1), pp. 25–27 (Jul. 1996).

Bhattacharya, Pijush, et al., "Comparative Study of Amorphous and Crystalline (Ba, Sr) $TiO_3$ Thin Films Deposited by Laser Ablation," Jpn. J. Appl. Phys. vol. 32, pp. 4103–4106 (1993) No month.

Varadan, V.K., et al., "Ceramic Phase Shifters for Electronically Steerable Antenna Systems," Microwave J. vol. 7, pp. 116–127 (Jan. 1992).

Xiang, X.–D., et al., "A Combinatorial Approach to Materials Discovery," Science, vol. 268, pp. 1738–1740 (Jun. 23, 1995).

Briceno, G., et al., "A Class of Cobalt Oxide Magnetoresistance Materials Discovered with Combinatoral Synthesis," Science, vol. 270, pp. 273–275 (Oct. 13, 1995).

Sun, X.–D., et al., "Identification and Optimization of Advanced Phosphors Using Combinatorial Libraries," Appl. Phys. Lett., vol. 70, pp. 3353–3355 (Jun. 23, 1997).

Xiang, X.–D., et al., "A Combinatorial Synthesis and Evaluation of Functional Materials," Physica C, 282–287, pp. 428–430 (1997) No month.

Takeuchi, I., et al., "Combinatorial Synthesis and Evaluation of Epitaxial Ferroelectric Device Libraries," Amer. Inst. of Physics, vol. 73, No. 7, pp. 894–896 (Aug. 17, 1998).

\* cited by examiner

*Primary Examiner*—Archene Turner
*Assistant Examiner*—Wendy Boss
(74) *Attorney, Agent, or Firm*—William C. Daubenspeck; Paul A. Gottlieb

(57) ABSTRACT

A dielectric thin film material for high frequency use, including use as a capacitor, and having a low dielectric loss factor is provided, the film comprising a composition of tungsten-doped barium strontium titanate of the general formula $(Ba_xSr_{1-x})TiO_3$, where X is between about 0.5 and about 1.0. Also provided is a method for making a dielectric thin film of the general formula $(Ba_xSr_{1-x})TiO_3$ and doped with W, where X is between about 0.5 and about 1.0, a substrate is provided, $TiO_2$, the W dopant, Ba, and optionally Sr are deposited on the substrate, and the substrate containing $TiO_2$, the W dopant, Ba, and optionally Sr is heated to form a low loss dielectric thin film.

6 Claims, 3 Drawing Sheets

| Fe Mg | Fe Y | Fe Mg | Fe Y | W Mg | W Y | W Mg | W Y |
|---|---|---|---|---|---|---|---|
| Cr | Cr | Mn | Mn | Cr | Cr | Mn | Mn |
| Fe | Fe La | Fe | Fe La | W | W La | W | W La |
| Cr | Cr | Mn | Mn | Cr | Cr | Mn | Mn |
| Fe Mg | Fe Y | Fe Mg | Fe Y | W Mg | W Y | W Mg | W Y |
| Ce | Ce | Ce | Ce | Ce | Ce | Ce | Ce |
| Fe | Fe La | Fe | Fe La | W | W La | W | W La |
| Ce | Ce | Ce | Ce | Ce | Ce | Ce | Ce |
| Mg | Y | Mg | Y | Ca Mg | Ca Y | Ca Mg | Ca Y |
| Cr | Cr | Mn | Mn | Cr | Cr | Mn | Mn |
| La | La | La | La | Ca | Ca La | Ca | Ca La |
| Cr | Cr | Mn | Mn | Cr | Cr | Mn | Mn |
| Mg | Y | Mg | Y | Ca Mg | Ca Y | Ca Mg | Ca Y |
| Ce | Ce | Ce | Ce | Ce | Ce | Ce | Ce |
| La | La | La | La | Ca | Ca La | Ca | Ca La |
| Ce | Ce | Ce | Ce | Ce | Ce | Ce | Ce |

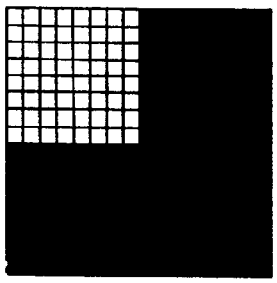
FIG. 1A
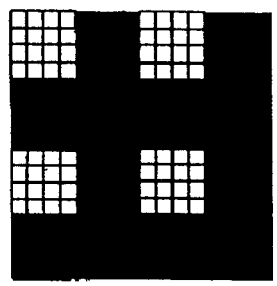
FIG. 1B
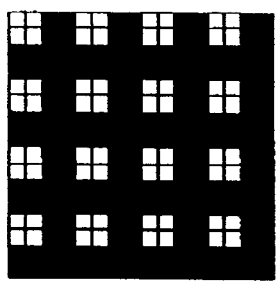
FIG. 1C
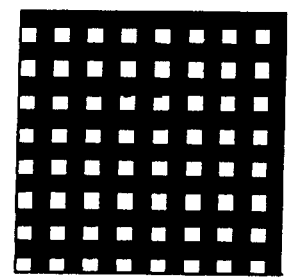
FIG. 1D
| Fe Mg Cr | Fe Y Cr | Fe Mg Mn | Fe Y Mn | W Mg Cr | W Y Cr | W Mg Mn | W Y Mn |
|---|---|---|---|---|---|---|---|
| Fe Cr | Fe La Cr | Fe Mn | Fe La Mn | W Cr | W La Cr | W Mn | W La Mn |
| Fe Mg | Fe Y | Fe Mg Ce | Fe Y Ce | W Mg | W Y | W Mg Ce | W Y Ce |
| Fe | Fe La | Fe Ce | Fe La Ce | W | W La | W Ce | W La Ce |
| Mg Cr | Y Cr | Mg Mn | Y Mn | Ca Mg Cr | Ca Y Cr | Ca Mg Mn | Ca Y Mn |
| Cr | La Cr | Mn | La Mn | Ca Cr | Ca La Cr | Ca Mn | Ca La Mn |
| Mg | Y | Mg Ce | Y Ce | Ca Mg | Ca Y | Ca Mg Ce | Ca Y Ce |
|  | La | Ce | La Ce | Ca | Ca La | Ca Ce | Ca La Ce |
FIG. 1E

TUNGSTEN-DOPED THIN FILM MATERIALS

GOVERNMENT RIGHTS

The United States Government has a paid-up license in this invention pursuant to Contract No. DE-AC03-76SF00098 between the United States Department of Energy and the University of California for management of the Lawrence Berkeley National Laboratory.

BACKGROUND OF THE INVENTION

1. Field of the Invention (Technical Field)

The invention generally relates to the composition and fabrication of thin films of tungsten-doped barium strontium titanate.

2. Background Art

Thin ferroelectric films have application as thin-film capacitor devices, as memory devices utilizing ferroelectric memories, including dynamic random access memory ("DRAM") devices, and for related applications. Ferroelectric materials are also being widely used in the development of new microwave devices such as frequency agile filters, phase shifters, and tunable high-Q resonators.

The utility of thin-film ferroelectric materials is directly related to the dielectric constant of the material and the dielectric loss or rate of leakage of the material. For example, the size of the capacitor used in a DRAM integrated circuit is the predominant element that determines the size of a DRAM cell. Thus, utilizing a thin-film capacitor that has either a higher dielectric constant or a lower loss may decrease the size of a DRAM cell. All else being equal, a capacitor with a high dielectric constant and a high loss is not as useful as a capacitor with a slightly lower dielectric constant coupled with a substantially lower loss. Thus, neither the dielectric constant nor the dielectric loss is an absolute measure of the utility of the thin-film ferroelectric materials, but utility is rather determined by the ratio of the dielectric constant to the loss, and the requirements for the specific application. For example, in DRAM applications, if lower power consumption is desired, such as might be obtained by a decreased reflashing or refreshing rate, then the loss is more critical than the dielectric constant.

Thus thin-film ferroelectric materials may be improved by either increasing the dielectric constant of the material (provided that the loss does not correspondingly increase), or by decreasing the loss of the material (provided that the dielectric constant does not correspondingly decrease). Many prior methods for increasing the dielectric constant of material have also increased the leakage current of the material. Some methods have sought to increase the dielectric constant of materials, even for high dielectric constant materials, without significantly increasing the leakage current. However, substantially less attention has been paid to producing high dielectric constant thin-film ferroelectric materials with decreased losses.

Metal oxide materials, including barium strontium titanate ("BST"), have been used as high dielectric constant thin-film ferroelectric materials. These materials, of the general composition $BaSrTiO_3$, have been intensely studied for such applications due to their comparatively low loss and high dielectric constants. Methods and compositions for utilizing BST materials are taught generally in U.S. Pat. No. 5,723,361 to Azuma and others, teaching methods to increase the dielectric constant of BST materials with little or no effect on leakage current; U.S. Pat. No. 5,853,500 to Joshi and Paz de Araujo, teaching methods of fabricating high dielectric constant BST materials; U.S. Pat. No. 5,874,379 to Joo and Joo, teaching improved BST dielectric films; and U.S. Pat. No. 5,889,696 to Kawakubo and others, teaching uses for BST materials. However, there remains a need for materials that have lower losses than current BST thin-film materials while maintaining dielectric constants that are not significantly lower than the dielectric constants of current BST thin-film materials.

There has not been a thorough and systematic study of the effects of dopants on the properties of BST thin-film materials, including use of dopants to create thin-film materials with a lower loss while maintaining acceptable dielectric constants, particularly in the microwave frequencies. Development and optimization of new dielectric or ferroelectric materials for microwave applications conventionally involves complicated materials synthesis and difficult microwave characterization measurements, and thus has not been undertaken in any systematic manner.

SUMMARY OF THE INVENTION (DISCLOSURE OF THE INVENTION)

There is provided a dielectric thin film comprising $(Ba_xSr_{1-x})TiO_3$ doped with W, wherein X is between about 0.5 and 1.0. In this dielectric thin film, W may be 1 mol % or greater, based on the total molarity of Ba, Sr and Ti. W may be elemental W, or may be in the form $WO_3$. In this dielectric thin film, the loss tangent of the film doped with W is substantially lower than the loss tangent of a film of the same composition but not doped with W.

There is also provided a dielectric thin film comprising $BaTiO_3$ doped with W. In this dielectric thin film, W may be 1 mol % or greater, based on the total molarity of Ba and Ti. W may be elemental W, or may be in the form $WO_3$. In this dielectric thin film, the loss tangent of the film doped with W is substantially lower than the loss tangent of a film of the same composition but not doped with W.

There is also provided a method of forming a dielectric thin film consisting of $(Ba_xSr_{1-x})TiO_3$ doped with W, wherein X is between about 0.5 and 1.0. This method includes the steps of: providing a substrate; depositing $TiO_2$, Ba, Sr and W on the substrate; and heating the substrate containing deposited $TiO_2$, Ba, Sr and W to form the thin film. In this method, the substrate may be a single crystal, and the substrate may further be $LaAlO_3$ or MgO. In this method, X may be 1, such that no Sr is deposited. W may be in any of a variety of forms, including elemental W and $WO_3$. In this method, the heating step may be conducted in the presence of flowing oxygen, may be at a temperature of at least 400° C., and may be for a period of at least 24 hours. In this method, there may also be a further step of annealing the substrate containing the thin film subsequent to the heating step. The further annealing may be at a temperature of at least 900° C., may be in the presence of flowing oxygen, and may be for a period of at least one and one-half hours.

A primary object of the present invention is to provide a BST thin-film material which, by reason of containing a tungsten dopant, has substantially lower dielectric loss or leakage, while maintaining an acceptable dielectric constant.

A further object of the present invention is to provide a barium titanate thin-film material which, by reason of containing a tungsten dopant, has substantially low dielectric loss or leakage, while maintaining an acceptable dielectric constant.

A further object of the present invention is to provide a thin ferroelectric film with a low dielectric loss or leakage and an acceptable dielectric constant, and having enhanced application, particularly for high-frequency or microwave applications, for uses such as DRAM, frequency agile filter, phase shifter, and tunable high-Q resonator devices.

A further object of the present invention is to provide a method for fabrication of thin ferroelectric BST or barium titanate films doped with tungsten, having a characteristic of a decreased leakage current.

A primary advantage of the present invention is that the low dielectric loss or leakage of the compositions of this invention permit the manufacture of smaller devices, including memory devices such as DRAM devices, and devices such as frequency agile filters, phase shifters, and tunable high-Q resonators.

Yet another advantage of the present invention is that the low dielectric loss or leakage of the compositions of this invention permit the manufacture of devices with a lower power consumption requirement, including memory devices such as DRAM devices, and devices such as frequency agile filters, phase shifters, and tunable high-Q resonators.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIGS. 1A–1D and FIG. 1E are schematic drawings of mask patterns and a representative dopant map, respectively;

Figure 2A:
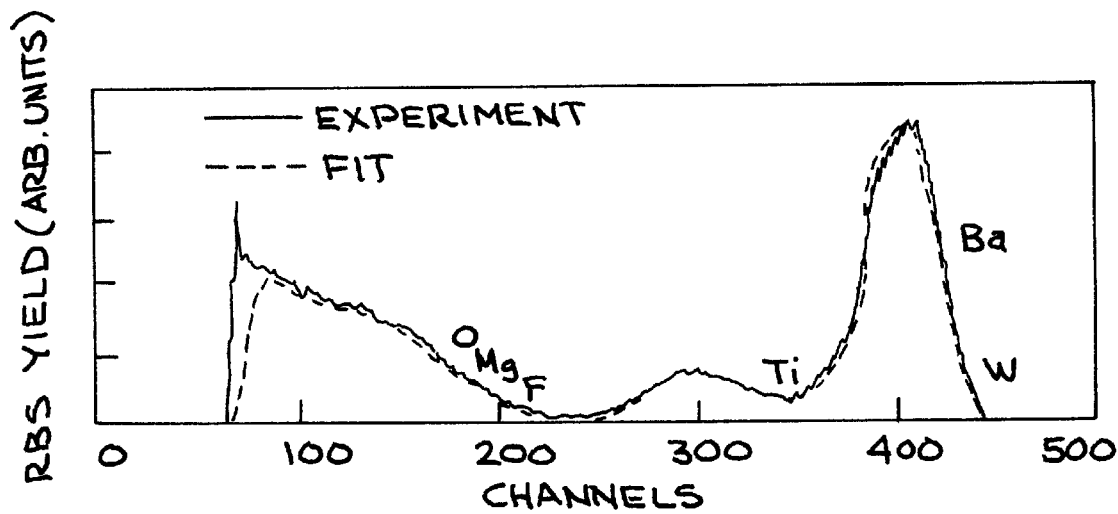
FIG. 2A and FIG. 2B are a Rutherford backscattering spectrum of a film of this invention and an x-ray distraction analysis, respectively, of a selected composition.

DESCRIPTION OF THE PREFERRED EMBODIMENTS (BEST MODES FOR CARRYING OUT THE INVENTION)

In the integrated circuit art, an acceptable crystalline material is often referred to as a "substrate." Herein, "substrate" may be used to refer to any specified layer or crystal structure, and most generally refers to any support for another layer. This may include any of a variety of silicon crystals, and may also include $LaAlO_3$ and MgO substrates, among others.

The term "metal oxide" herein includes materials of the general form $(Ba_xSr_{1-x})TiO_3$, where Ba, Sr (if provided) and Ti are cations and O is the anion oxygen.

The crystalline metal oxide composition preferably has a perovskite type structure as will be understood by those skilled in the art. These metal oxides are classified as ferroelectrics, and typically exhibit ferroelectricity at room temperature. Ferroelectrics of the invention typically have high dielectric constants and relatively low dielectric losses, and are useful in high dielectric constant capacitors, whether or not they exhibit ferroelectric properties at normal operating temperatures.

In a material having the form $(Ba_xSr_{1-x})TiO_3$, the ratio of Ba to Sr material is variable but the total number of Ba and Sr atoms is fixed with respect to Ti atoms and O atoms. This ratio is expressed as a formula template $(Ba_xSr_{1-x})Tio_3$ indicating that the total of Ba and Sr atoms equals one (X+1−X=1) combined with one Ti atom and three O atoms. Therefore, though the total of Ba, Sr and Ti atoms is fixed by the stoichiometric formula, the ratio of Ba to Sr atoms is expressed as the ratio X/(1−X).

In the specification and claims, and particularly with respect to the amount of W, the amount of W is expressed in terms of mole % units (denoted mol %). The term "W" is intended to include tungsten and tungsten compounds. This unit is a measure of the number of atoms of W as a percentage of the stoichiometric amount of Ba, Sr and Ti atoms in the underlying metal oxide material. For example, if the material is $(Ba_{0.7}Sr_{0.3})TiO_3$, and the tungsten doping concentration is 10 mol %, then the tungsten concentration would be 10% of total molarity of barium, strontium and titanium.

The dielectric loss, leakage loss or dissipation loss of a dielectric material is referred to herein as the loss tangent (tan δ). The dielectric constant is referred to herein as $\in_r$.

Thin-layer films of the general formula $(Ba_xSr_{1-x})TiO_3$, where x is equal to between about 0.5 and 1.0, are provided, to which a tungsten dopant has been added. These thin-layer films thus include films of the formula $BaTiO_3$, as well as films of the general formula $(Ba_xSr_{1-x})TiO_3$, as described above where x is some number less than one. The tungsten dopant may be in any suitable form, including elemental W and $WO_3$.

To make these thin-layer films on a substrate, any means for thin layer deposition of metal oxides known to the art may be employed. In one preferred embodiment, $LaAlO_3$ is employed as a single-crystal substrate, and rf sputtering is used as a means for thin layer deposition. To fabricate the thin-layer films, $TiO_2$ to a suitable thickness, such as 870 Å, is first deposited on the single-crystal $LaAlO_3$ substrate. The tungsten dopant is then added by similar deposition means. The tungsten dopant may be elemental W, such as W to a thickness of 5 Å, or may be $WO_3$ or other similar tungsten formulations. This is then followed by deposition of Ba and Sr in the amounts required for the selected stoichiometric formula, it being understood that Ba and Sr may be in any appropriate form, including $BaF_2$ and $SrF_2$. In this way, the dopant layer can be sandwiched between $TiO_2$ and the fluoride materials, if provided, such that the fluoride materials more effectively prevent excessive evaporation of the tungsten dopant during the subsequent annealing steps.

The resulting composition consisting of the substrate and layer deposition materials is then heated for a suitable period of time, such as at 400° C. in flowing oxygen for 24 hours, such that mixing of each of $TiO_2$, $BaF_2$, and $SrF_2$ is facilitated, and the tungsten dopant is sufficiently diffused. This may then be followed by a further annealing step, such as heating in flowing oxygen at 900° C. for 1.5 hours.

In an alternative embodiment, a MgO substrate can be employed. In one such embodiment, $BaTiO_3$ doped with $WO_3$ is formed, such as by deposition of $TiO_2$, deposition of $WO_3$, and deposition of $BaF_2$, followed by the heating steps as described.

INDUSTRIAL APPLICABILITY

Ferroelectric materials are widely used in the development of new microwave devices, including as frequency agile filters, phase shifters, and tunable high-Q resonators, and in DRAM memory cells, as taught generally in L. A. Knauss, J. M. Pond, J. S. Horwitz, and D. B. Chrisey, *Appl. Phys. Lett.* 69:25–27 (1996) and P. Bhattacharya, T. Komeda, K. Park, and Y. Nishioka, *Jpn. J. Appl. Phys.*, 32:4103–4106 (1993). $(Ba_xSr_{1-x})TiO_3$ (BST) compounds have been studied and suggested for such applications. V. K. Varadan, D. K. Ghodgaonkar, V. V. Varadan, J. F. Kelly, and P. Glikerdas, *Microwave J.* 7:116–127 (1992). A lower loss BST thin layer material would have application in a wide variety of high frequency and microwave applications, including those set forth above. Particularly in the case of microwave applications, where the dielectric constant values of BST compounds are generally considered to be high, minor reduction in the dielectric constant may be tolerable as long as there is a noticeable improvement in dielectric loss.

The invention is further illustrated by the following non-limiting examples.

EXAMPLE 1

A library of 256 differently doped thin films of $(Ba_xSr_{1-x})TiO_3$ (where $0.5<x<1.0$) was generated on a 1 in. X 1 in. $LaAlO_3$ substrate using multi-step thin-film deposition techniques together with a quaternary masking strategy. The combinatorial library methods were generally as described in X.-D. Xiang, X. Sun, G. Briceno, Y. Lou, K. Wang, H. Chang, W. G. Wallace-Freedman, S. Chen, and P. G. Schultz, *Science* 268:1738–1740 (1995); G. Briceno, H. Chang, X. Sun, P. G. Schultz, and X.-D. Xiang, *Science* 270:273–275 (1995); X. Sun, C. Gao, J. Wang, and X.-D. Xiang, *Appl. Phys. Lett.* 70:3353–3355 (1997); and X.-D. Xiang and P. G. Schultz, *Physica C* 282–287:428–430 (1997).

The library consisted of four different stoichiometries of $(Ba_xSr_{1-x})TiO_3$ thin films, where x=1.0, 0.8, 0.7, and 0.5. The four stoichiometric BST compounds were then doped with different combinations of up to three out of nine different metallic elements, with each dopant added in excess of 1 mol % with respect to the BST host.

The library was fabricated using a series of precisely positioned physical shadow masks, allowing the sequential deposition of each library constituent at different sites on a substrate. Deposition was by rf sputtering. The quaternary combinatorial masking scheme depicted in FIGS. 1A–1D was used to generate $4^4=256$ different compositions in 16 steps, with each of the 256 compositions being 650 μm X 650 μm. The quaternary mask pattern depicted in FIGS. 1A–1D successively subdivides the substrate into self-similar patterns of quadrants. The rth ($1 \leq r \leq 4$) mask contains $4^{r-1}$ windows, where each window exposes one-quarter of the area deposited with the preceding mask. Within each window there is an array of $4^{4-r}$ sample sites. Each mask is used in up to four sequential deposition steps, each time rotated by 90°.

To fabricate the library $TiO_2$ to a thickness of 870 Å was first deposited on a single-crystal $LaAlO_3$ substrate. This was then followed by deposition of $BaF_2$ and $SrF_2$, if required, in the amounts required for the four stoichiometric BST compositions. The different dopants were then deposited in the following sequence:

$B_1$: $Fe_2O_3$ (7 Å);
$B_2$: W(5 Å);
$B_3$: $CaF_2$(12 Å);
$C_1$: Cr (4 Å);
$C_2$: $Mn_3O_4$ (7 Å);
$C_3$: $CeO_2$(12 Å);
$D_1$: MgO (7 Å);
$D_2$: $Y_2O_3$ (10 Å);
$D_3$: $La_2O_3$(12 Å);
$A_1$: $BaF_2$(1640 Å);
$A_2$: $SrF_2$ (270 Å)+$BaF_2$ (1320 Å);
$A_3$: $SrF_2$ (410 Å)+$BaF_2$ (940 Å); and
$A_4$: $SrF_2$ (680 Å)+$BaF_2$ (830 Å), where A, B, C, and D are the quaternary masks used in the deposition steps on FIGS. 1A–1D, and the subscript number, designated "i", represents an (i–1)×90° clockwise rotation of the mask relative to the orientation of the mask as shown in FIGS. 1A–D. The numbers in parentheses indicate the deposited film thickness. The resulting dopant map of the library, which was the same for each of the four stoichiometric BST compositions, is shown in FIG. 1E. The dopant map depicted in FIG. 1E is for the $BaTiO_3$ ("BTO") quadrant of the library (where x=1); the same map applies to the remaining quadrants which contain stoichiometric BST compounds.

The dopant layers were sandwiched between $TiO_2$ and the fluoride materials, where indicated, to prevent excessive evaporation of dopants during subsequent annealing steps. Following deposition of the dopant layers, the library was then heated at 400° C. in flowing oxygen for 24 hours to facilitate mixing of each of the constituent elements, consisting of $TiO_2$, $BaF_2$, and, if provided, $SrF_2$, and to provide for diffusion of the dopants. Following this step, the library was further annealed in flowing oxygen at 900° C. for 1.5 hours.

EXAMPLE 2

Larger individual samples of selected compositions were fabricated and processed concurrently with the libraries. These control samples were analyzed by Rutherford backscattering (RBS) and x-ray diffraction (XRD) to independently characterize the materials in the library. The RBS spectrum of a $BaF_2/WO_3/TiO_2$ precursor-multilayer sample deposited on a MgO substrate and processed as described in Example 1 to form $WO_3$-doped $BaTiO_3$ (BTO) is shown in FIG. 2A. The fit to the spectrum indicates that the ratios of elements present at different depths in the film are close to 1 and 10 for Ba to Ti and Ba to W, respectively, which is consistent with the intended composition. This result indicates that diffusion of the dopant into the film is reasonably uniform. Similar results were obtained for BST with x=0.8, 0.7, and 0.5.

EXAMPLE 3

Figure 2B:
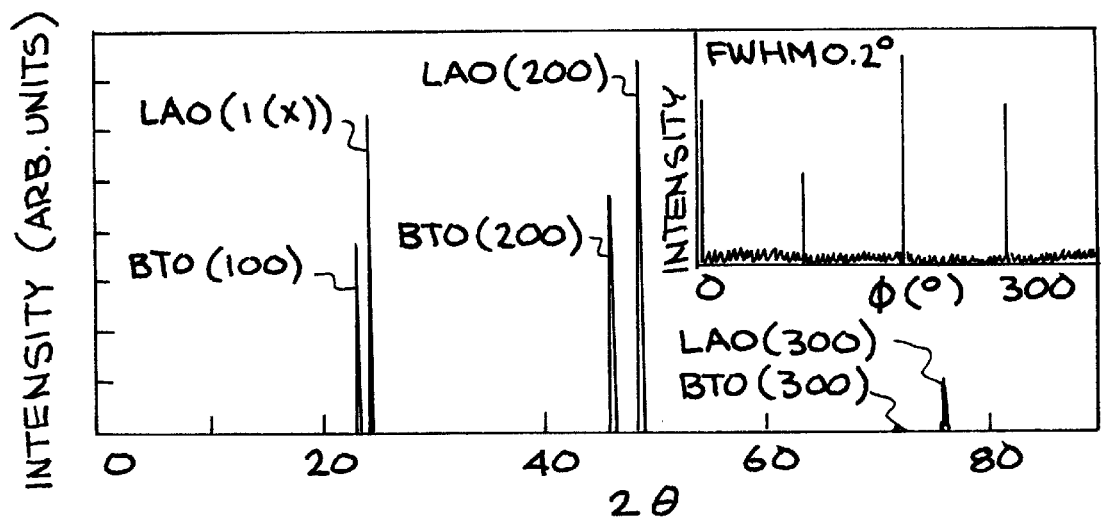

A θ-2θ XRD scan of an annealed and undoped $BaF_2/TiO_2$ thin film sample on a $LaAlO_3$ substrate is shown in FIG. 2B. The <100> peaks of BTO are clearly visible with no traces of other phases. The out-of-plane lattice constant is 3.99 Å, indicative of an a-axis oriented film. The BTO film itself was approximately 1800 Å thick. The inset of FIG. 2B shows a φ scan of (110) planes of the BTO film; the fourfold symmetry demonstrates to the epitaxial growth of the film. The full width at half maximum of the peaks in the φ scans and rocking curves of the films are often less than 0.2°, again reflecting the excellent crystalline quality of the films.

EXAMPLE 4

Atomic force microscopy was performed directly on selected samples made by the method of Example 2. The root-mean-square surface roughness of the doped BTO films (5 $\mu$m×5 $\mu$m area) was 12±1 nm, with a total film thickness of 200 nm. The grain size was, typically, 200 nm ×200 nm, with no signs of out-growths at the surface. These are all indications that the method of stepwise film synthesis from precursor multilayers yielded high-quality thin layer films, comparable to those made by conventional in situ methods from stoichiometric targets on hot substrates.

EXAMPLE 5

In order to nondestructively measure the electrical impedance of the library samples of Example 1 at microwave frequencies, a scanning-tip microwave near-field microscope ("STMNM") was used to obtain the values of dielectric constants ($\in_r$) and tan $\delta$ of the thin-film library samples with submicron spatial resolution at 1 GHz. For STMNM, 1000 Å thick Ag electrodes were fabricated on the surface of the films using a photolithographic lift-off process. The electrodes had a gap spacing of 9 $\mu$m, a finger width of 11 $\mu$m, and a finger length of 700 $\mu$m. The capacitances were measured at 1 MHz using an HP4280A C meter.

Figures 3A, 3B:
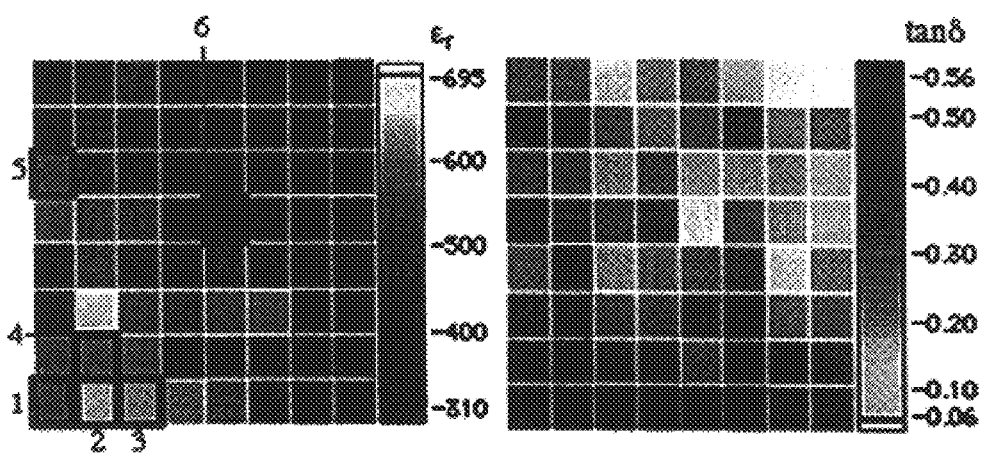
FIG. 3A and FIG. 3B are graphic representations of the dielectric constant and the loss tangent, respectively, of doped films of this invention.

The microwave impedance images of the BTO containing region of the library, consisting of 64 samples, is shown in FIGS. 3A and 3B. Each square corresponds to a different thin-film sample site. The data were converted to averaged $\in_r$ and tan $\delta$ values for each site from images of resonant frequency and Q shifts, respectively.

In FIG. 3A, which depicts the $\in_r$ image of the library, a lower dielectric constant is represented by a darker shade, and shows that samples on the upper-right-hand quadrant have a lower value of $\in_r$ relative to pure BTO, which is marked as sample 1 in FIG. 3A. The sites in the upper-right-hand quadrant contain 1 mol % W (see FIG. 1E), which indicates that doping with W results in a somewhat lower dielectric constant for BTO. This trend was also observed in other thin-layer films with different ratios of Ba and Sr. In general, most dopants decreased $\in_r$, except for a few instances like La- and Ce-doped samples, shown as samples 2 and 3, respectively, in FIG. 3A. A comparison of samples that differ only in being doped with either La or Y, but are otherwise identical, revealed that the samples doped with the larger ion La have a higher $\in_r$, compared to those doped with Y. This is evident in the alternating light and dark sites on the even columns of the $\in_r$ image of samples with the BTO host shown in FIG. 3A. The differences between La-doped and Y-doped samples became less pronounced in samples containing higher concentrations of Sr.

In FIG. 3B, which depicts the tan $\delta$ image of the library, a lighter shade represents a lower loss tangent (tan $\delta$). Thus, all samples in the W-doped upper-right-hand quadrant, which have reduced $\in_r$ slightly, also have a lower loss tangent in comparison to pure BTO. In FIG. 3B, the sample location is the same as in FIG. 3A. Thus, the tan $\delta$ of W-doped BTO, which is sample 6, is reduced to 0.1 from 0.42 for compared to undoped BTO, which is sample 1, while its $\in_r$ is reduced to 406 from a value of 593. The reduction in tan $\delta$ by doping with W was also observed in the other in the other thin-layer films with different ratios of Ba and Sr.

EXAMPLE 6

Individual thin-layer films were fabricated with selected compositions identical to those of the samples in the library, and the dielectric properties of these individual thin-layer films were measured using the interdigital contact electrode method at 1 MHz. The results of this testing, together with the results at 1 GHz obtained by STMNM methods as described in Example 5, are shown in Table 1 below.

TABLE 1. Dielectric constant ($\in_r$) and loss tangent (tan $\delta$) of thin films measured at 1 GHz and 1 MHz.

TABLE 1

Dielectric constant ($\epsilon_r$) and loss tangent (tan $\delta$) of thin films measured at 1 GHz and 1 MHz.

| Films | Sample | $\epsilon_r$ (1 GHz) | tan $\delta$ (1 GHz) | $\epsilon_r$ (1 MHz) | tan $\delta$ (1 MHz) |
|---|---|---|---|---|---|
| $BaTiO_3$ | 1 | 593 | 0.42 | 843 | 0.094 |
| $BaTiO_3/La_2O_3$ | 2 | 695 | 0.35 | 870 | 0.037 |
| $BaTiO_3/CeO_2$ | 3 | 634 | 0.45 | 857 | 0.047 |
| $BaTiO_3/Y_2O_3$ | 4 | 576 | 0.54 | 796 | 0.063 |
| $BaTiO_3/Fe_3O_4,MgO$ | 5 | 559 | 0.28 | 567 | 0.042 |
| $BaTiO_3/W$ | 6 | 406 | 0.10 | 500 | 0.025 |
| $BaTiO_3/WO_3$ | 7 | — | — | 529 | 0.018 |
| $SrTiO_3$ | 8 | 215 | 0.02 | — | — |
| $SrTiO_3/WO_3$ | 9 | 177 | 0.01 | — | — |

The data acquired at both frequencies (1 GHz and 1 MHz) show similar trends, which is to be expected since the frequency dependence of the dielectric properties of BST is known to be monotonic between 1 MHz and 1 GHz. Both measurements show an increase in $\in_r$ when BTO is doped with La (sample 2 in FIG. 3A) or Ce (sample 3), and a decrease when BTO is doped with W (sample 6) or Fe and Mg (sample 5). A separate BTO film doped with 1 mol % $WO_3$ was also made. Its dielectric constant at 1 MHz is similar to that of the film doped with elemental W, suggesting that different initial oxidation states of this dopant do not affect the dielectric properties of the doped materials. The change in $\in_r$ from 1 GHz to 1 MHz for the sample doped with Fe and Mg is almost negligible compared to the other films. This may mean that doping with Fe and Mg reduces the frequency dispersion of BTO. This is important for applications requiring a material with low-frequency dispersion. At 1 MHz, W-doped samples displayed the lowest tangent loss, consistent with the measurements taken by STMNM at 1 GHz. The dielectric constant and loss tangent of pure and W-doped $SrTiO_3$ films were also measured and listed in Table 1 for comparison.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A dielectric thin film for high frequency applications comprising $(Ba_xSr_{1-x})TiO_3$ doped with W, wherein X is between about 0.5 and 1.0, and wherein W is 1 mol % or greater, based on the total molarity of Ba, Sr, and Ti.

2. The dielectric thin film of claim 1, wherein W is $WO_3$.

3. The dielectric thin film of claim 1, wherein the loss tangent of the film doped with W is substantially lower than the loss tangent of a film of the same composition but not doped with W.

4. A dielectric thin film for high frequency applications comprising $BaTiO_3$ doped with W, wherein W is 1 mol % or greater, based on the total molarity of Ba and Ti.

5. The dielectric thin film of claim 4, wherein W is $WO_3$.

6. The dielectric thin film of claim 4, wherein the loss tangent of the film doped with W is substantially lower than the loss tangent of a film of the same composition but not doped with W.

* * * * *